United States Patent
Sengupta et al.

(10) Patent No.: US 9,443,851 B2
(45) Date of Patent: Sep. 13, 2016

(54) SEMICONDUCTOR DEVICES INCLUDING FINFETS AND LOCAL INTERCONNECT LAYERS AND METHODS OF FABRICATING THE SAME

(71) Applicant: Samsung Electronics Co., Ltd., Suwon-si (KR)

(72) Inventors: Rwik Sengupta, Austin, TX (US); Raheel Azmat, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/534,536

(22) Filed: Nov. 6, 2014

(65) Prior Publication Data
US 2015/0194427 A1    Jul. 9, 2015

Related U.S. Application Data

(60) Provisional application No. 61/923,407, filed on Jan. 3, 2014.

(51) Int. Cl.
| | |
|---|---|
| *H01L 27/088* | (2006.01) |
| *H01L 21/8234* | (2006.01) |
| *H01L 27/02* | (2006.01) |
| *H01L 21/768* | (2006.01) |

(52) U.S. Cl.
CPC ..... *H01L 27/0886* (2013.01); *H01L 21/76895* (2013.01); *H01L 21/823431* (2013.01); *H01L 21/823475* (2013.01); *H01L 27/0207* (2013.01)

(58) Field of Classification Search
CPC ............. H01L 27/0886; H01L 21/768; H01L 21/823431; H01L 21/823475; H01L 27/02
USPC ........................................................ 257/401
See application file for complete search history.

(56) References Cited

U.S. PATENT DOCUMENTS

| | | |
|---|---|---|
| 6,274,409 B1 | 8/2001 | Choi |
| 7,176,125 B2 | 2/2007 | Laiw |
| 7,423,310 B2 | 9/2008 | Verhoeven |
| 8,173,491 B2 | 5/2012 | Law et al. |
| 8,344,427 B2 | 1/2013 | Omura |
| 8,381,162 B2 | 2/2013 | Pelloie |
| 8,513,707 B2 | 8/2013 | Herberholz |
| 2009/0045515 A1 | 2/2009 | Gonzalez, Jr. et al. |
| 2012/0032275 A1* | 2/2012 | Haran ............... H01L 21/28518 257/401 |
| 2013/0074029 A1 | 3/2013 | Blatchford |
| 2013/0075758 A1 | 3/2013 | Masuda et al. |
| 2013/0119474 A1* | 5/2013 | Schultz ............. H01L 21/76895 257/368 |

(Continued)

FOREIGN PATENT DOCUMENTS

DE    10 2012 219 375 A1    6/2013

*Primary Examiner* — Peter Bradford
(74) *Attorney, Agent, or Firm* — Myers Bigel & Sibley, P.A.

(57) ABSTRACT

Semiconductor devices and methods of forming the same are provided. The semiconductor devices may include a finFET, a metal routing layer, a first local interconnect layer, and a second local interconnect layer. The finFET may include a channel, a first source/drain region, a second source/drain region, and a gate stack. The metal routing layer may be separated from the finFET in a vertical direction. The first local interconnect layer may include a first local interconnect that contacts a first metal route in the metal routing layer and that electrically connects to the first source/drain region. The second local interconnect layer may include a second local interconnect that contacts a second metal route in the metal routing layer and that electrically connects to the gate stack.

18 Claims, 9 Drawing Sheets

(56) References Cited

U.S. PATENT DOCUMENTS

| | | |
|---|---|---|
| 2013/0146986 A1* | 6/2013 | Rashed .......... H01L 21/823418 257/369 |
| 2013/0193489 A1 | 8/2013 | Baars et al. |
| 2013/0248961 A1 | 9/2013 | Xia |
| 2014/0097496 A1* | 4/2014 | Hu .................. H01L 21/823481 257/368 |
| 2014/0264499 A1* | 9/2014 | Yuan .................... H01L 23/485 257/288 |
| 2015/0270176 A1* | 9/2015 | Xie ................. H01L 21/823475 257/384 |

* cited by examiner

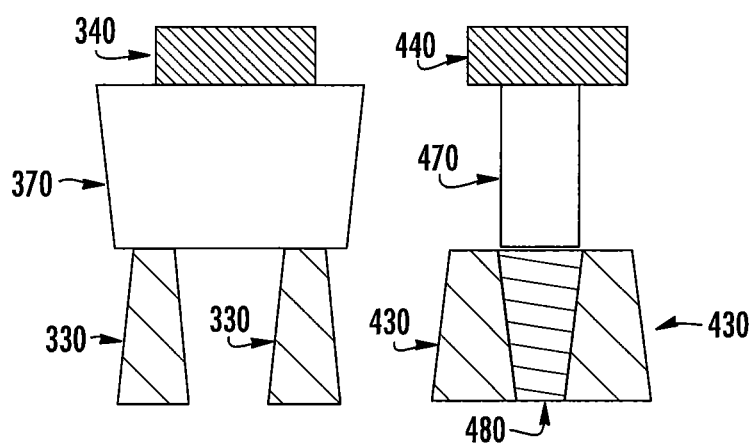

SEMICONDUCTOR DEVICES INCLUDING FINFETS AND LOCAL INTERCONNECT LAYERS AND METHODS OF FABRICATING THE SAME

CROSS-REFERENCE TO RELATED APPLICATION

This application claims priority under 35 U.S.C. §120 to U.S. Provisional Application Ser. No. 61/923,407, entitled LOW COST STANDARD CELL ARCHITECTURE AND LOCAL INTERCONNECT SCHEME FOR SUB-OPTICAL ILLUMINATION ENABLED PROCESS TECHNOLOGIES, filed in the USPTO on Jan. 3, 2014, the disclosure of which is incorporated herein by reference in its entirety.

FIELD

Some embodiments of the inventive concept relate generally to semiconductor devices and, more particularly, to finFET semiconductor devices and methods of forming the same.

BACKGROUND

In semiconductor devices, contacting schemes may be a large factor in balancing technology cost and scalability. For example, high density logic and bit cells may require efficient contacting schemes to utilize back end resources effectively. However, using too many layers used in contacts increases mask cost, and therefore increases wafer cost compared to semiconductor devices with fewer contact layers. A single additional mask level may increase cost by an amount in the order of millions of dollars. Therefore, each layer requiring a separate mask may increase fixed cost of a semiconductor device by a similar amount. Each technology generation may require a reduction in the sizes of standard cells. Corresponding to the required size reduction, local interconnects have been introduced for intra-cell routing to avoid congestion in the metal routing layers. An additional via layer may be used to provide an ohmic electrical connection between the local interconnect layers and the metal routing layers.

Reference is now made to FIG. 1, which is a plan view schematically illustrating a conventional semiconductor device including a plurality of finFETs. A conventional semiconductor device 100 may include finFETs 11-12 disposed on a substrate. Each finFET 11-12 may include a channel with source/drain regions on opposing sides of the channel. A gate stack 31-32 may be disposed on a top surface of the channel and may extend down sidewalls of the channel. Ones of trench contact regions 21-23 may be disposed on each of the source/drain regions. In some embodiments, trench contact regions 21-23 may each provide an ohmic electrical connection between multiple source/drain regions for finFETs containing multiple parallel fins. A metal routing layer may be separated from the finFETs in a vertical direction. The metal routing layer may include metal routes 41-42. For example, the metal routes 41-42 may include a power rail 41. The power rail 41 may not be above the trench contact regions 21-23 in a vertical direction. A first local interconnect 51 in a first local interconnect layer may extend from the trench contact region 21 to under the power rail 41. The first local interconnect layer may contact the trench contact layer and may not contact the metal routing layer. Thus, the first local interconnect 51 may contact trench contact region 21 and may not contact power rail 41. A via 61 may extend vertically from the first local interconnect 51 to contact the power rail 41. A trench contact region 22, a first local interconnect 52, and a via 63 may provide an ohmic electrical connection between a source/drain region and a metal route 42. Similarly, a second local interconnect 70 and a via 64 may provide an ohmic electrical connection between a gate stack 31-32 and another metal route 43.

Reference is now made to FIGS. 2A-2C, which are partial elevation views that are schematic in nature and illustrate select components of conventional semiconductor devices. As illustrated in FIG. 2A, a trench contact region 20, a first local interconnect 50, and a via 60 may provide an ohmic electrical connection between a source/drain region and a metal route 40. A second local interconnect 70, and a via 60 may provide an ohmic electrical connection between a gate stack 30 and a metal route 40. As illustrated in FIG. 2B, a first local interconnect 50 and respective trench contact regions 20 may provide an ohmic electrical connection between a plurality of source/drain regions. A via 60 may provide an ohmic electrical connection between the first local interconnect 50 and a metal route 40. As illustrated in FIG. 2C, a second local interconnect 70 may provide an ohmic electrical connection between a plurality of gate stacks 30. A via 60 may provide an ohmic electrical connection between the second local interconnect 70 and a metal route 40.

SUMMARY

According to some embodiments of the inventive concept, semiconductor devices are provided. A semiconductor device may include a finFET, a metal routing layer including first and second metal routes, a first local interconnect layer including a first local interconnect, and a second local interconnect layer including a second local interconnect. The first finFET may include a channel, a first source/drain region that is adjacent a first side of the channel, a second source/drain region that is adjacent a second side of the channel that is opposite the first side, and a gate stack on a top surface of the channel and that extends down a sidewall surface of the channel. The first and second metal routes may be separated from the finFET in a vertical direction. The first local interconnect may contact the first metal route and may provide an ohmic electrical connection between the first metal route and the first source/drain region. The second local interconnect may contact the second metal route and may provide an ohmic electrical connection between the second metal route and the gate stack.

In some embodiments, the first local interconnect may provide an ohmic electrical connection between the first metal route and the first source/drain region through a trench contact region that extends from the first local interconnect to the first source/drain region.

In some embodiments, the finFET may be a first finFET and the semiconductor device may include a second finFET. The first local interconnect may extend in a direction that is substantially parallel to the channel of the first finFET and may provide an ohmic electrical connection between the first source/drain region of the first finFET and a third source/drain region of the second finFET.

In some embodiments, the first local interconnect may extend over the gate stack of the first finFET and may be electrically insulated from the gate stack of the first finFET.

In some embodiments, the first local interconnect may provide an ohmic electrical connection between the first source/drain region of the first finFET, the third source/drain region of the second finFET, and a power rail in the metal routing layer.

In some embodiments, the first local interconnect may include a linearly shaped conductive structure that may contact the power rail along a length of the structure.

In some embodiments, the linearly shaped conductive structure of the first local interconnect may include first and second appendages. The first and second appendages may each extend in a direction that is substantially perpendicular to the length of the structure. The first appendage may provide an ohmic electrical connection between the power rail and the first source/drain region of the first finFET. The second appendage may provide an ohmic electrical connection between the power rail and the third source/drain region of the second finFET.

In some embodiments, the finFET may be a first finFET and the semiconductor device may include a second finFET. The second local interconnect may extend in a direction that is substantially parallel to the channel of the first finFET and may provide an ohmic electrical connection between the gate stack of the first finFET and a gate stack of a second finFET.

In some embodiments, the finFET may be a first finFET and the semiconductor device may include a second finFET and a polycrystalline silicon region. The polycrystalline silicon region may contact the gate stack of the first finFET and may extend in a direction that is substantially parallel to the channel of the first finFET. The polycrystalline silicon region may provides an ohmic electrical connection between the gate stack of the first finFET and a gate stack of a second finFET.

In some embodiments, the second local interconnect may contact the polycrystalline silicon region.

According to some embodiments of the inventive concept, methods of manufacturing semiconductor devices are provided. The methods may include forming multiple finFETs on a first surface of semiconductor substrate. The methods may include forming multiple trench contact regions that may contact ones of source/drain regions of the finFETs. A first distance from top surfaces of the trench contact regions to the first surface of the semiconductor substrate may be greater than a second distance from top surfaces of gate stacks of the finFETs to the first surface of the semiconductor substrate. The methods may include forming multiple first local interconnects that may contact ones of the trench contact regions. The methods may include forming multiple second local interconnects that may contact ones of the gate stacks of the finFETs. Top surfaces of the second local interconnects may be substantially coplanar with top surfaces of the first local interconnects. The methods may include forming a metal routing layer. The metal routing layer may include multiple conductors that may contact ones of the first and second local interconnects.

In some embodiments, forming multiple finFETs may include forming a first finFET, a second finFET, and a polycrystalline silicon region that may extend from a first gate stack of the first finFET to a second gate stack of the second finFET in a direction that is substantially parallel to fins of the first and second finFETs.

In some embodiments, forming multiple trench contact regions may include forming a trench contact region that may extend from a first source/drain region of a first finFET to a second source/drain region of a second finFET in a direction that is substantially parallel to fins of the first and second finFETs.

In some embodiments, forming multiple first local interconnects may include forming a first local interconnect that may extend from a first source/drain region of a first finFET to a second source/drain region of a second finFET in a direction that is substantially parallel to fins of the first and second finFETs.

In some embodiments, the first local interconnect that may extend from the first source/drain region of the first finFET to the second source/drain region of the second finFET may contact a power rail along a length of the first local interconnect and may include first and second appendages that extend in a direction that is substantially perpendicular to the length of the first local interconnect. The first appendage may provide an ohmic electrical connection between the power rail and the first source/drain region of the first finFET. The first appendage may provide an ohmic electrical connection between the power rail and the second source/drain region of the second finFET.

In some embodiments, forming multiple second local interconnects may include forming a second local interconnect that may extend from a first gate stack of a first finFET to a second gate stack of a second finFET in a direction that is substantially parallel to fins of the first and second finFETs.

According to some embodiments of the inventive concept, integrated circuits are provided. An integrated circuit may include multiple finFETs, multiple first local interconnects in a first local interconnect layer, a second local interconnect in a second local interconnect layer, and a metal routing layer. The multiple finFETs may include a first p-channel finFET, a second p-channel finFET, a first n-channel finFET, and a second n-channel finFET. Each of the multiple finFETs may include a channel, first and second source/drain regions on opposing sides of the channel, trench contact regions on the source/drain regions, and a gate stack on a top surface of the channel and that extends down a sidewall surface of the channel. Ones of the first local interconnects may include a lower surface that may contact ones of the trench contact regions of the multiple finFETs and may include an upper surface that may contact ones of an output route, a power rail, and a ground rail of the metal routing layer. Ones of the first local interconnects may provide an ohmic electrical connection between the ones of the source/drain regions of the multiple finFETs and respective ones of the output, the power rail, and the ground rail. The second local interconnect may include a lower surface that may contact ones of the gate stacks of the multiple finFETs and may include an upper surface that may contact an input route of the metal routing layer. The second local interconnect may provide an ohmic electrical connection between the ones of the gate stacks of the plurality of finFETs and the input route. The metal routing layer may include the input, the output, the power rail, and the ground rail. The channel of the first p-channel finFET may be substantially collinear to the channel of the second p-channel finFET. The first source/drain region of the first p-channel finFET may contact the first source/drain region of the second p-channel finFET. The second source/drain region of one of the first and second p-channel finFETs may be ohmically connected to the power rail. Gate stacks of the first and second n-channel finFETs may be substantially collinear to and may contact gate stacks of the first and second p-channel finFETs respectively. The channel of the first n-channel finFET may be substantially collinear to the channel of the second n-channel finFET. The first source/drain region of the first n-channel finFET may contact the first source/drain region of the second n-channel finFET. The second source/drain region of one of the first and second p-channel finFETs may be ohmically connected to the ground rail.

In some embodiments, the power and ground rails may extend in a direction that is substantially parallel to the channels of ones of the multiple finFETs. The second source/drain region of the one of the first and second p-channel finFETs may be ohmically connected to the power rail through a first local interconnect that may include a first linearly shaped conductive structure and a first appendage contacting the first linearly shaped conductive structure. The first linearly shaped conductive structure may contact the power rail along a length of the first linearly shaped conductive structure. The first appendage may extend in a direction that is substantially perpendicular to the length of the first linearly shaped conductive structure and may provide an ohmic electrical connection between the first linearly shaped conductive structure and the second source/drain region of the one of the first and second p-channel finFETs. The second source/drain region of the one of the first and second n-channel finFETs may be ohmically connected to the ground rail through a first local interconnect that may include a second linearly shaped conductive structure and a second appendage contacting the second linearly shaped conductive structure. The second linearly shaped conductive structure may contact the ground rail along a length of the second linearly shaped conductive structure. The second appendage may extend in a direction that is substantially perpendicular to the length of the second linearly shaped conductive structure and may provide an ohmic electrical connection between the second linearly shaped conductive structure and the second source/drain region of the one of the first and second n-channel finFETs.

In some embodiments, the gate stack of the first n-channel finFET and gate stack of the first p-channel finFET may be ohmically connected to the gate stack of the second n-channel finFET and the gate stack of the second p-channel finFET through a second local interconnect that may extend in a direction that is substantially parallel to the channels of one of the multiple finFETs.

In some embodiments, the gate stack of the first n-channel finFET and the gate stack of the first p-channel finFET may be ohmically connected to the gate stack of the second n-channel finFET and the gate stack of the second p-channel finFET through a through a polycrystalline silicon region that may extend in a direction that is substantially parallel to the channels of one of the multiple finFETs.

It is noted that aspects of the inventive concept described with respect to one embodiment, may be incorporated in a different embodiments although not specifically described relative thereto. That is, all embodiments and/or features of any embodiments can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

FIGS. 5-8 are partial elevation views that are schematic and illustrate select components of semiconductor devices according to some embodiments of the inventive concept.

DETAILED DESCRIPTION OF THE EMBODIMENTS

Figure 1:
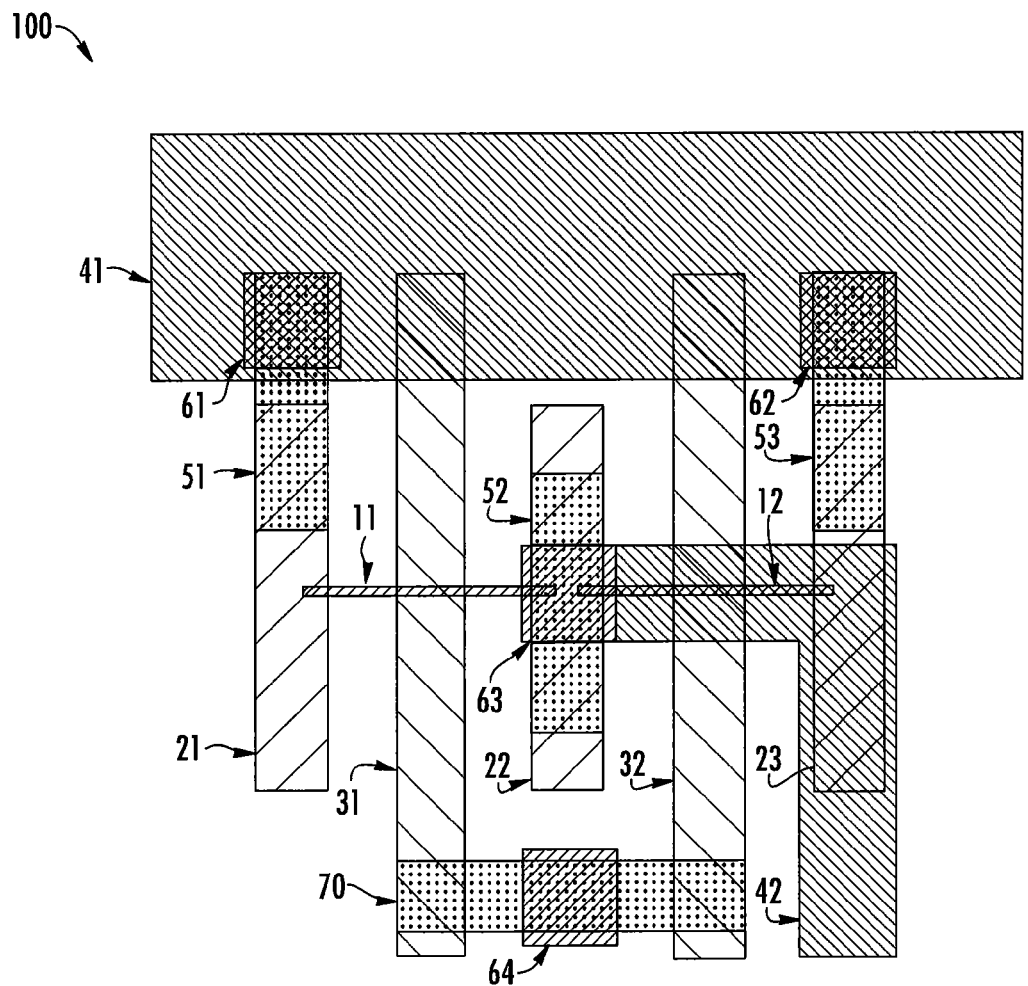
FIG. 1 is a plan view schematically illustrating a conventional semiconductor device including a plurality of finFETs.
Figure 2:
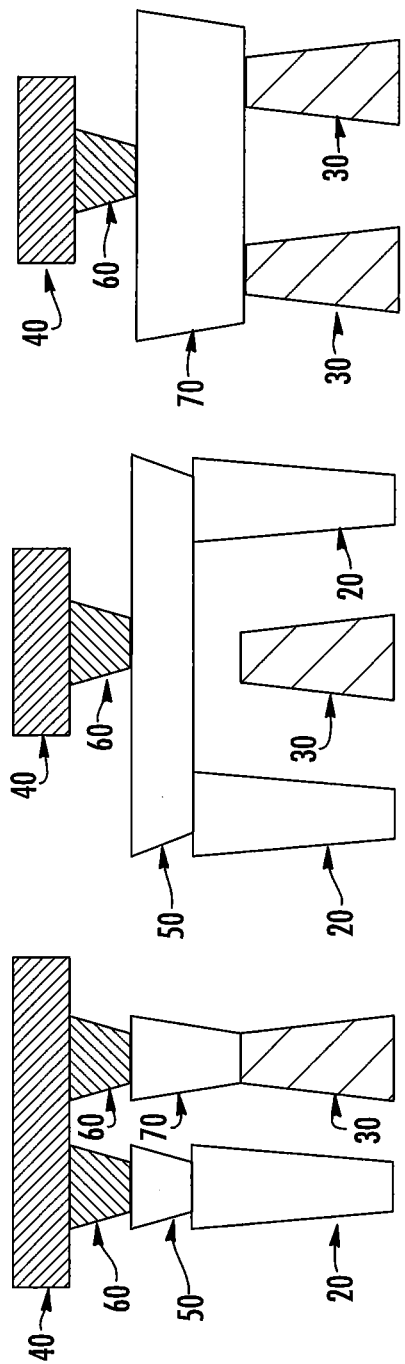
FIGS. 2A-2C are partial elevation views that are schematic and illustrate select components of conventional semiconductor devices.

Embodiments are described in detail with reference to the accompanying drawings. The inventive concept, however, may be embodied in various different forms, and should not be construed as being limited only to the illustrated embodiments set forth herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

The terminology used herein is for the purpose of describing particular embodiments only and is not intended to be limiting of the inventive concept. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Example embodiments of aspects of the present inventive concept explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices, such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Figure 3:
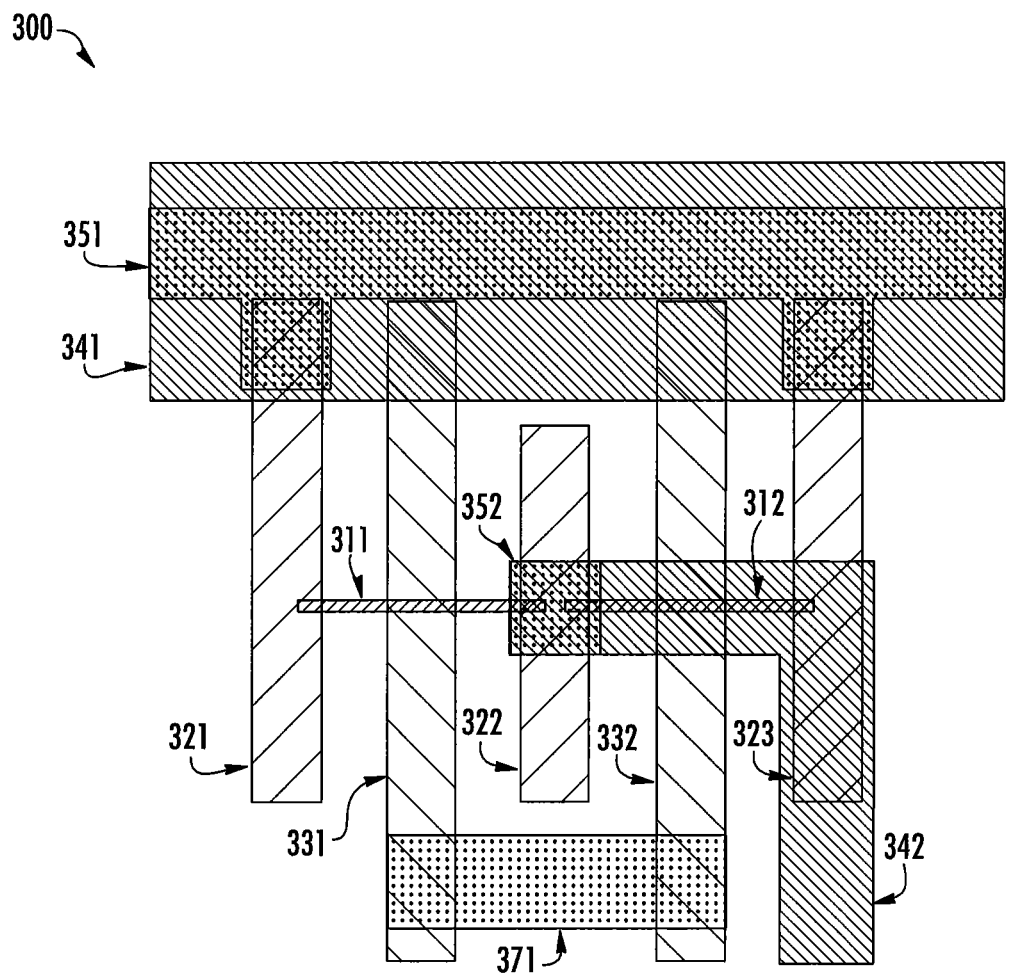
FIG. 3 is a plan view schematically illustrating a semiconductor device according to some embodiments of the inventive concept.

Reference is now made to FIG. 3, which is a plan view schematically illustrating a semiconductor device according to some embodiments of the inventive concept. A semiconductor device 300 may include multiple finFETs 311-312 disposed on a substrate. Each finFET 311-312 may include a channel with source/drain regions on opposing sides of the channel. A gate stack 331-332 may be disposed on a top surface of respective channels of the finFETs 311-312 and extending down sidewalls of the respective channels. A trench contact region 321-323 may be disposed on ones of the source/drain regions of the finFETs 311-312.

In some embodiments, ones of the finFETs 311-312 may include multiple fins arranged parallel to each other. The gate stacks 331-332 may span across top surfaces of the multiple fins and may extend down sidewalls of channels of the multiple fins. The trench contact regions 321-323 may electrically connect multiple source/drain regions of the multiple fins. It will be understood that to "electrically connect," when used herein, will refer to providing an ohmic electrical connection between elements.

In some embodiments, a power rail 341 may be disposed in a metal routing layer that may be separated from the finFETs 311-312 in a vertical direction. The trench contact region 321 may extend from a source/drain region of finFET 311 to under the power rail 341. In other words, the power rail 341 may be directly above a portion of trench contact region 321.

In some embodiments, a first local interconnect 351 in a first local interconnect layer may extend in a vertical direction from the trench contact region 321 to the power rail 341. The first local interconnect 351 may contact the trench contact region 321 and may contact the power rail 341 without a via therebetween. A source/drain region of finFET 311 may electrically connect to the metal route 341 through the trench contact region 321 and the first local interconnect 351.

In some embodiments, the first local interconnect 351 may extend substantially parallel to an orientation of a fin of a first finFET 311. The first local interconnect 351 may electrically connect a source/drain region of the first finFET 311 to a source/drain region of a second finFET 312. In some embodiments, the first local interconnect 351 may include a substantially linear shape. The first local interconnect 351 may contact the power rail 341 along a length of the linear shape. Thus, in some embodiments, the first local interconnect 351 may electrically connect multiple source/drain regions to the power rail 341. In some embodiments, the first local interconnect may include a comb-like structure. In other words, the first local interconnect 351 may include a substantially linear shaped structure and one or more appendages that extend therefrom in a direction that is substantially perpendicular to a length of the linear shape. An appendage may extend from the linearly shaped structure to contact a trench contact region 321 to electrically connect to a respective source/drain region. In some embodiments, multiple appendages may extend from the linearly shaped structure to contact respective trench contact regions, 321 and 323, to electrically connect multiple source/drain regions. A size of the appendages of the first local interconnect layer 351 may be determined so as to guarantee acceptable resistance connection between the power rail 341 and the respective trench contact regions, 321 and 323. In some embodiments, appendages may extend in opposing directions from the linearly shaped structure.

In some embodiments, a first local interconnect 352 in the first local interconnect layer may extend in a vertical direction from a trench contact region 322 to a metal route 342. The first local interconnect 352 may contact the trench contact region 322 and may contact the metal route 342 without a via therebetween. A source/drain region of finFET 311 may electrically connect to the metal route 342 through the trench contact region 322 and the first local interconnect 352. In some embodiments, the first local interconnect 352 may include a roughly square shaped structure. In some embodiments, the first local interconnect 352 may include a rectangular shaped structure.

In some embodiments, a second local interconnect 371 in a second local interconnect layer may extend in a vertical direction from a gate stack 331. The second local interconnect 371 may contact the gate stack 331 and may contact the metal routing layer without a via therebetween. In some embodiments, the second local interconnect 371 may electrically connect the gate stack 321 to a metal route (not shown). In some embodiments, the second local interconnect 371 may extend from one gate stack 331 to another gate stack 332 to form an electrical connection therebetween. In some embodiments, the second local interconnect may electrically connect multiple gate stacks 331-332 to a metal route (not shown).

Figure 4:
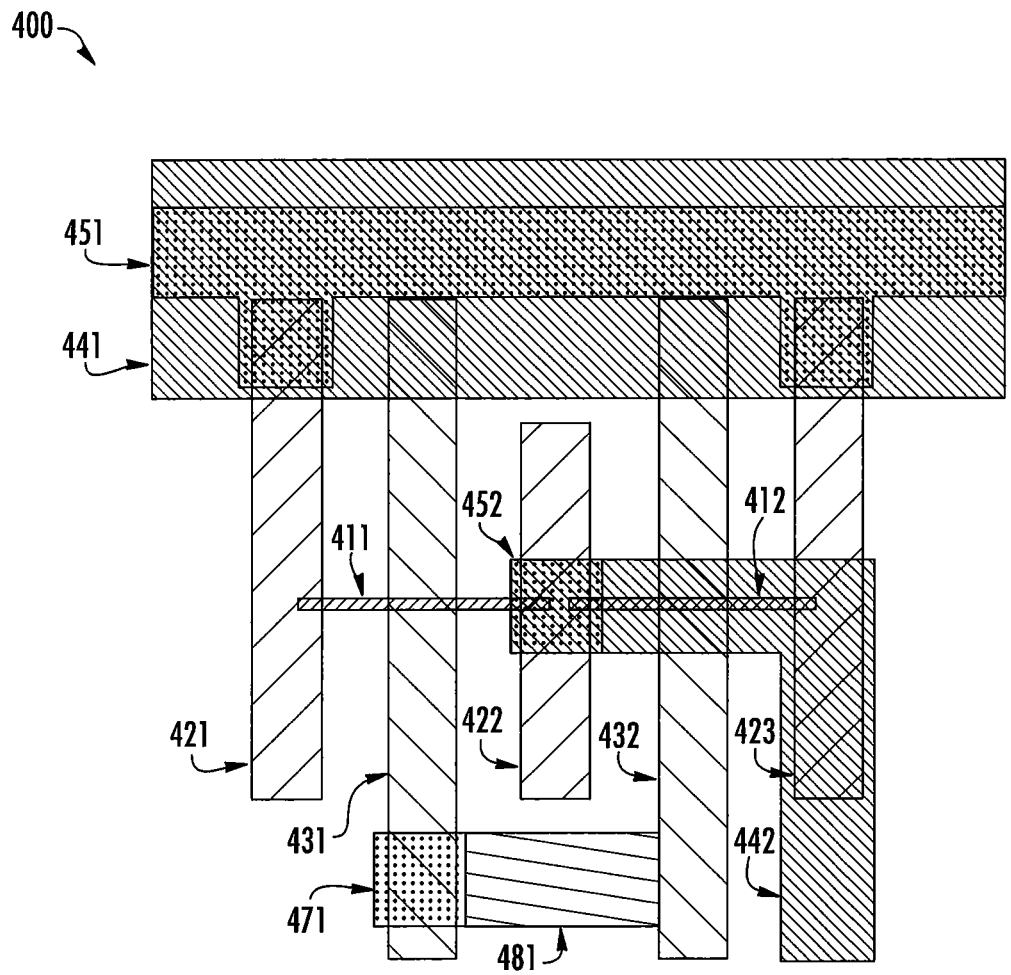
FIG. 4 is a plan view schematically illustrating a semiconductor device according to some embodiments of the inventive concept.

Reference is now made to FIG. 4, which is a plan view schematically illustrating a semiconductor device according to some embodiments of the inventive concept. As illustrated, a semiconductor device 400 may be substantially similar to the semiconductor device 300 of FIG. 3 except a polycrystalline silicon region 481 may extend from a gate stack 431 of a first finFET 411 to a gate stack 432 of a second finFET 412 to form an electrical connection therebetween. In some embodiments, the polycrystalline silicon region 481 may be formed concurrently with the gate stacks 431-432.

In some embodiments, a second local interconnect 471 may contact one of the gate stacks 431 and/or the polycrystalline silicon region 481 to electrically connect the gate stacks 431-432 to a metal route (not shown). In some embodiments, the second local interconnect 471 may include a roughly square shaped structure. In some embodiments, the second local interconnect 471 may include a rectangular shaped structure.

Reference is now made to FIGS. 5-8, which are partial elevation views that are schematic in nature and illustrate select components of semiconductor devices according to some embodiments of the inventive concept. The illustrations of FIGS. 5-8 are not drawn to scale and may omit intervening structures. The elements of FIGS. 5-8 may be drawn from different cross-sectional planes.

Figures 5, 6:
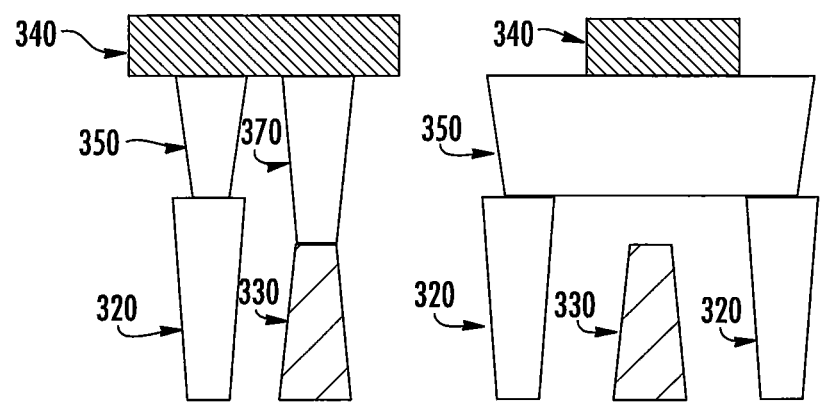

Referring to FIG. 5, a first local interconnect 350 may extend from a trench contact region 320 to a metal route 340. In some embodiments, the metal route may be an input route, and output route, a power rail, and/or a ground rail. The first local interconnect 350 may contact the trench contact region 320 and the metal route 340 without a via therebetween. A source/drain region of a finFET may be electrically connected to the metal route through the trench contact region 320 and first local interconnect 350. In some embodiments, a second local interconnect 370 may extend from a gate stack 330 to the metal route 340. The second local interconnect 370 may contact the gate stack 330 and the metal route 340 without a via therebetween. The gate stack 330 may be electrically connected to the metal route 340 through the second local interconnect 370. In some embodiments, the source/drain region connected to the trench contact region 320 may be electrically connected to the gate stack 330 through the first local interconnect 350, the metal route 340, and the second local interconnect 370. In some embodiments, the first and second interconnects may contact separate respective metal routes and the source/drain region connected to the trench contact region 320 may not be electrically connected to the gate stack 330. In some embodiments, the finFET of the gate stack 330 may be different from the finFET of the source/drain region connected to the trench contact region 320. The trench contact region 320 and the gate stack 330 may not be adjacent. In other words, there may be other gate stacks and/or trench contact regions (not illustrated) between the illustrated trench contact region 320 and gate stack 330. In some embodiments, the trench contact region 320 and the gate stack 330 may be disposed in different cross-sectional planes.

Referring to FIG. 6, a first local interconnect 350 may extend from a trench contact region 320 to another trench contact region 320. The first local interconnect 350 may contact the trench contact regions 320. A source/drain region contacting one of the trench contact regions 320 may be electrically connected to another source/drain region contacting the other trench contact region 320 through the first local interconnect 350 and the respective trench contact regions 320. The first local interconnect 350 may contact a metal route 340 without a via therebetween. The source/drain regions contacting the trench contact regions 320 may electrically connect to the metal route 340 through the first local interconnect 350 and the respective trench contact regions 320. A top surface of the trench contact regions 320 may be higher in a vertical direction than a top surface of a gate stack 330. Therefore, the first local interconnect 350 may extend over the gate stack 330 without contacting the gate stack 330. The first local interconnect 350 may be electrically insulated from the gate stack 330. The gate stack 330 may not be adjacent to one or both of the trench contact regions 320. In other words, there may be other gate stacks and/or trench contact regions (not illustrated) between the illustrated trench contact regions 320 and gate stack 330. In some embodiments, one or more of the trench contact regions 320 and the gate stack 330 may be disposed in different cross-sectional planes.

Referring to FIG. 7, a second local interconnect 370 may extend from a gate stack 330 to another gate stack 330. The second local interconnect 370 may contact the gate stacks 330. The gate stacks 330 may be electrically connected to each other through the second local interconnect 370. The second local interconnect 370 may contact a metal route 340 without a via therebetween. The gate stacks 330 may electrically connect to the metal route 340 through the second local interconnect 370. A top surface of the gate stacks 330 may not be sufficiently high in a vertical direction to extend over a trench contact region 320, as shown in FIG. 6. Therefore, the second local interconnect may be routed around trench contact regions 320 to be electrically insulated from the trench contact regions 320. The gate stacks 330 may not be adjacent to each other. In other words, there may be other gate stacks and/or trench contact regions (not illustrated) between the illustrated gate stacks 330. In some embodiments, the gate stacks 330 may be disposed in different cross-sectional planes.

Referring to FIG. 8, a polycrystalline silicon region 480 may extend from a gate stack 430 to an adjacent gate stack 430 in a direction that is substantially perpendicular to lengths of the gate stacks 430. The polycrystalline silicon region 480 may contact the gate stacks 430 and provide an electrically connection therebetween. A top surface of the polycrystalline silicon region 480 may be at substantially the same height as top surfaces of the gate stacks 430. A second local interconnect 470 may extend in a vertical direction from one or more of the polycrystalline silicon region 480 and the gate stacks 430 to a metal route 440. The second local interconnect 370 may contact the metal route 340 without a via therebetween. The polycrystalline silicon region 480 and the gate stacks 430 may be electrically connected to the metal route 440 through the second local interconnect 470.

Figure 9:
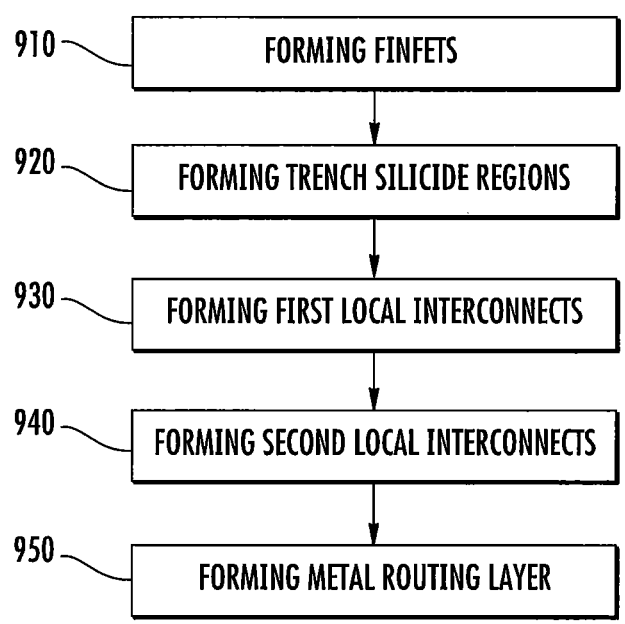
FIG. 9 is a flowchart illustrating operations in methods of manufacturing the semiconductor devices of FIGS. 3 and 4 according to some embodiments of the inventive concept.

FIG. 9 is a flowchart illustrating operations in methods of manufacturing the semiconductor devices of FIGS. 3 and 4 according to some embodiments of the inventive concept. Referring to FIG. 3 and FIG. 9, first and second finFETs 311-312 may be formed on a first surface of semiconductor substrate (block 910). Referring to FIG. 4 and FIG. 9, in some embodiments, first and second finFETs 411-412 and a polycrystalline silicon region 481 that may extend from a first gate stack 431 of the first finFET 411 to a second gate stack 432 of the second finFET 412 in a direction that is substantially parallel to fins of the finFETs 411-412 may be formed simultaneously (block 910). For example, in some embodiments, multiple semiconductor fins may be formed on a semiconductor substrate. Gate stacks 331-332 may be formed on top surfaces of respective fins and extending down sidewalls of respective fins. In some embodiments, the gate stacks 331-332 may include polycrystalline silicon. In some embodiments, ones of the gate stacks 331-332 may include an insulating oxide layer contacting the respective semiconductor fin. In some embodiments, portions of the fins not covered by the gate stacks 331-332 may be selective etched and source/drain regions may be epitaxially grown on opposing sides of the fins.

Referring back to FIG. 3 and FIG. 9, multiple trench contact regions 321-323 may be formed on the source/drain regions of the finFETs 311-312 (block 920). The trench contact regions 321-323 may be formed taller than gate stacks 331-332 of the finFETs 311-312. In other words, a first distance from top surfaces of the plurality of trench contact regions 321-323 to the first surface of the semiconductor substrate may be greater than a second distance from top surfaces of the gate stacks 331-332 to the first surface of the semiconductor substrate. In some embodiments, a trench contact region 322 may be formed that may extend from a first source/drain region of a first finFET 312 to a second source/drain region of a second finFET 311 in a direction that is substantially parallel to fins of the first and second finFETs 311-312. In some embodiments, the finFETs 311-312 may each include multiple parallel fins. The trench contact regions 321-323 may be formed to extend in a direction that is substantially perpendicular to the parallel fins to electrically connect respective source/drain regions on opposing sides of the gate stacks 331-332 of the finFETs 311-312. In some embodiments, lengths of the trench contact regions 321-323 may not be uniform. The trench contact regions 321-323 may be configured to provide electrical connections to the respective source/drain regions of the finFETs 311-312.

Multiple first local interconnects 351-352 may be formed on the trench contact regions 321-323 (block 930). In some embodiments, a first local interconnect 351 may be formed to provide an electrical connection between trench contact regions 351-352. For example, in some embodiments, first local interconnect 351 may be formed to include a linearly shaped conductive structure extending from one trench contact region 321 to another trench contact region 323 in a direction that is substantially parallel to fins of the first and second finFETs 311-312. In some embodiments, first local interconnect 351 may include a plurality of appendages on the linearly shaped conductive structure that extend in a direction that is substantially perpendicular to a length of the linearly shaped conductive structure. Ones of the appendages may electrically connect to the trench contact regions, 321 and 323, respectively. In some embodiments, a first local interconnect 352 may be formed to provide an electrical connection to only one trench contact region 322. For example, first local interconnect 352 may extend vertically. In some embodiments, the first local interconnect 352 may include a roughly square shaped structure. In some embodiments, the first local interconnect 352 may include a rounded shaped structure. The first local interconnects 351-352 may be configured to provide electrical connections to the trench contact regions 321-323.

A second local interconnect 371 may be formed on gate stacks 331-332 (block 940). In some embodiments, multiple second local interconnects may be formed. A top surface of the second local interconnect 371 may be substantially coplanar with top surfaces of the first local interconnects 351-352. In some embodiments, the second local interconnect 371 may be formed to contact gate stacks 331-332 and provide an electrical connection between gate stacks 331-332. For example, in some embodiments, second local interconnect 371 may be formed to include a linearly shaped conductive structure extending from one gate stack 331 to another gate stack 332 in a direction that is substantially parallel to fins of the first and second finFETs 311-312. In some embodiments, a second local interconnect 471 of FIG. 4 may be formed contacting only one trench contact region. For example, second local interconnect 471 may extend vertically. In some embodiments, the second local interconnect 471 may include a roughly square shaped structure. In some embodiments, the second local interconnect 471 may include a rounded shaped structure. The second local interconnect 371 may be configured to provide an electrical connection to the gate stacks, 331 and 332.

Multiple metal routes 341-342 may be formed on respective first local interconnects, 321-323, in a metal routing layer (block 950). In some embodiments, metal routes may be formed on second local interconnects. The metal routes 341-342 may contact ones of the first and second local interconnects without a via therebetween. In some embodiments, ones of the metal routes may provide electrical connections between ones of the first and second local interconnects. In some embodiments, the metal routes may include input routes, output routes, power rails, and ground rails. Input routes may provide a voltage representing a logic level as an input to a semiconductor device. Output routes may provide a voltage representing a logic level as an output from a semiconductor device. Power rails may provide an operating voltage to a semiconductor device. Ground rails may provide an electrical ground reference to a semiconductor device. For example, a power rail 341 may be formed on first local interconnect 351. The power rail 341 may contact the first local interconnect 351 without a via therebetween. The power rail 341 may be configured to provide an operating voltage to source/drain regions of finFETs 311 and 312. The power rail 341 may extend along a length of the first local interconnect 351. The power rail 341 may be configured to contact the first local interconnect 351 along the length of the first local interconnect 351 to provide a lower contact resistance.

Figure 10:
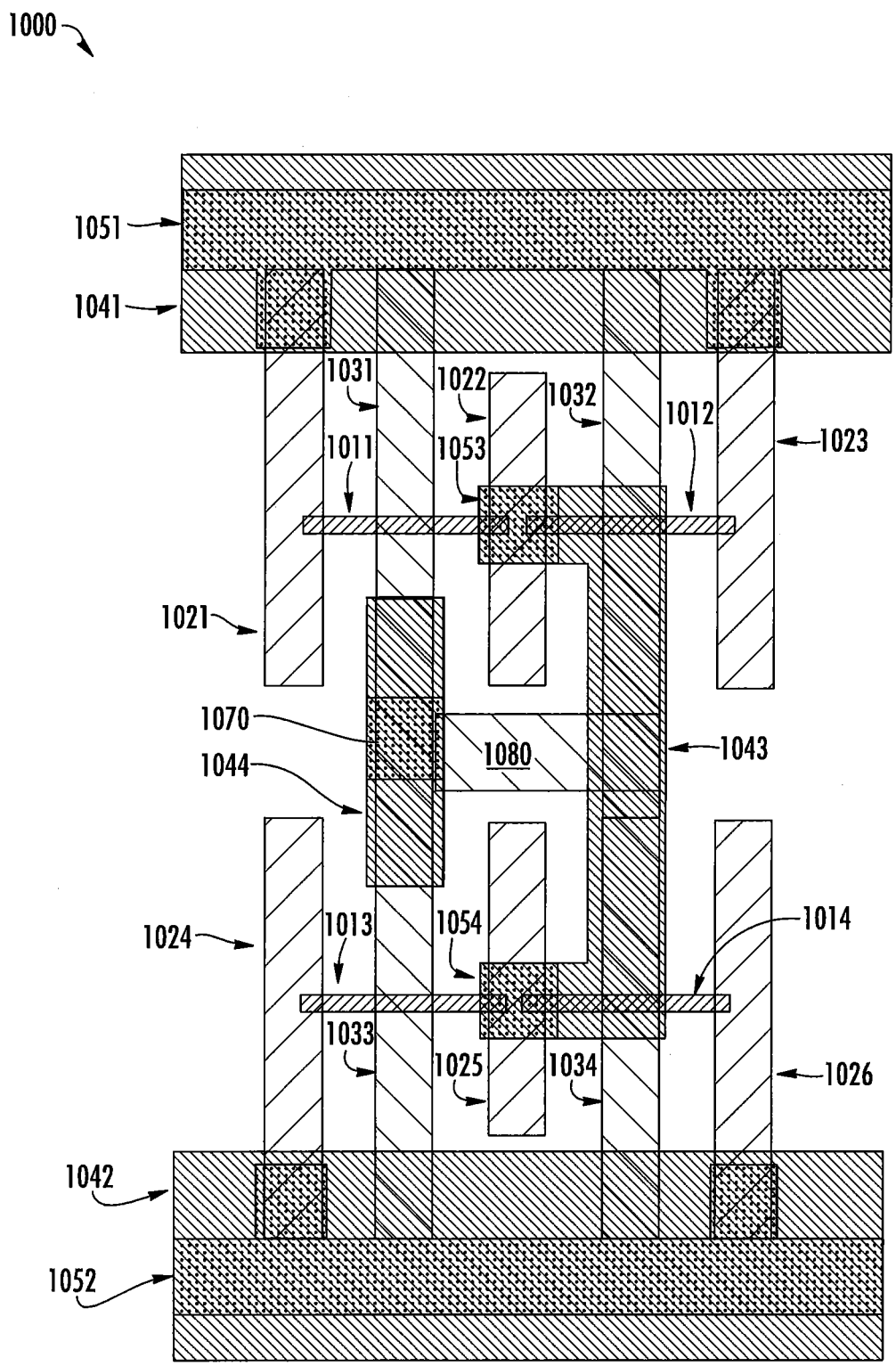
FIG. 10 is a plan view schematically illustrating a semiconductor device according to some embodiments of the inventive concept.

Reference is now made to FIG. 10, which is a plan view schematically illustrating a semiconductor device according to some embodiments of the inventive concept. An integrated circuit 1000 may include a first p-channel finFET 1011, a second p-channel finFET 1012, a first n-channel finFET 1013, and a second n-channel finFET 1014. Each of the finFETs 1011-1014 may include a channel, first and second source/drain regions on opposing sides of the channel, trench contact regions 1021-1026 on the source/drain regions, and a gate stack 1031-1034 on a top surface of the channel and that extends down a sidewall surface of the channel. In some embodiments, the finFETs 1011-1014 may each include a plurality of channels parallel to and/or separated apart from each other.

As illustrated, the first p-channel finFET 1011 may have first and second source/drain regions contacting trench contact regions 1021 and 1022, respectively. The channel of the first p-channel finFET 1011 may be substantially collinear to the channel of the second p-channel finFET 1012. The first p-channel finFET 1011 may have first and second source/drain regions contacting trench contact regions 1022 and 1023, respectively. In some embodiments, the second source/drain region of the first p-channel finFET 1011 may be electrically connected to the first source/drain region of the second p-channel finFET 1012 through the trench contact region 1022. In some embodiments, the second source/drain region of the first p-channel finFET 1011 may contact the first source/drain region of the second p-channel finFET 1012.

As illustrated, the first n-channel finFET 1013 may have first and second source/drain regions contacting trench contact regions 1024 and 1025, respectively. The second n-channel finFET 1014 may have first and second source/drain regions contacting trench contact regions 1025 and 1026, respectively. In some embodiments, the second source/drain region of the first n-channel finFET 1013 may be electrically connected to the first source/drain region of the second n-channel finFET 1014 through the trench contact region 1025. In some embodiments, the second source/drain region of the first n-channel finFET 1013 may contact the first source/drain region of the second n-channel finFET 1014.

In some embodiments, gate stacks of the first n-channel finFET 1013 and second n-channel finFET 1014 may be substantially collinear with gate stacks of the first p-channel finFET 1011 and second p-channel finFET 1012, respectively. In some embodiments, gate stacks of the first n-channel finFET 1013 and second n-channel finFET 1014 may contact gate stacks of the first p-channel finFET 1011 and second p-channel finFET 1012, respectively.

A first local interconnect layer may include a plurality of first local interconnects 1051-1054 that may electrically connect ones of the source/drain regions of the plurality of finFETs 1011-1014 to metal routes 1041-1043.

In some embodiments, a first local interconnect 1051 may electrically connect the first source/drain region of the first p-channel finFET 1011 and the second source/drain region of the second p-channel finFET 1012 to a power rail 1041. The power rail 1041 may provide an operating voltage to the integrated circuit 1000. The first local interconnect 1051 may include a linearly shaped conductive structure that may extend substantially parallel to the channels. The first local interconnect 1051 may include first and second appendages that may extend from the linearly shaped conductive structure to respectively contact trench contact regions 1021 and 1023, to electrically connect to the respective source/drain regions. The first local interconnect 1051 may contact the power rail 1041 along a length of the linear shape to provide a lower electrical resistance therebetween.

In some embodiments, a first local interconnect 1052 may electrically connect the first source/drain region of the first n-channel finFET 1013 and the second source/drain region of the second n-channel finFET 1014 to a ground rail 1042. The first local interconnect 1052 may include a linearly shaped conductive structure that may extend substantially parallel to the channels. The first local interconnect 1052 may include first and second appendages that may extend from the linearly shaped conductive structure to respectively contact trench contact regions, 1024 and 1026, to electrically connect to the respective source/drain regions. The first local interconnect 1052 may contact the ground rail 1042 along a length of the linear shape to provide a lower electrical resistance therebetween.

In some embodiments, a metal route 1043 may electrically connect the second source/drain region of the first p-channel finFET 1011 and the first source/drain region of the second p-channel finFET 1012 to the second source/drain region of the first n-channel finFET 1013 and the first source/drain region of the second n-channel finFET 1014. A first local interconnect 1053 may extend from the metal route 1043 to the trench contact region 1022 to electrically connect to the second source/drain region of the first p-channel finFET 1011 and the first source/drain region of the second p-channel finFET 1012. Similarly, a first local interconnect 1054 may extend from the metal route 1043 to the trench contact region 1025 to electrically connect to the second source/drain region of the first n-channel finFET 1013 and the first source/drain region of the second n-channel finFET 1014. In some embodiments, the metal route 1043 may provide a logical output from the integrated circuit 1000.

In some embodiments, a polycrystalline silicon region 1080 may extend from gate stacks 1031 and 1033 to gate stacks 1032 and 1034 to provide an electrical connection therebetween. In some embodiments, a second local interconnect 1070 may extend from one or more of the gate stacks 1031-1034 or the polycrystalline silicon region 1080 to electrically connect the gate stacks 1031-1034 of the finFETs 1011-1014 to a metal route 1044. In some embodiments, the metal route 1044 may provide a logical input to the integrated circuit 1000.

Figure 11:
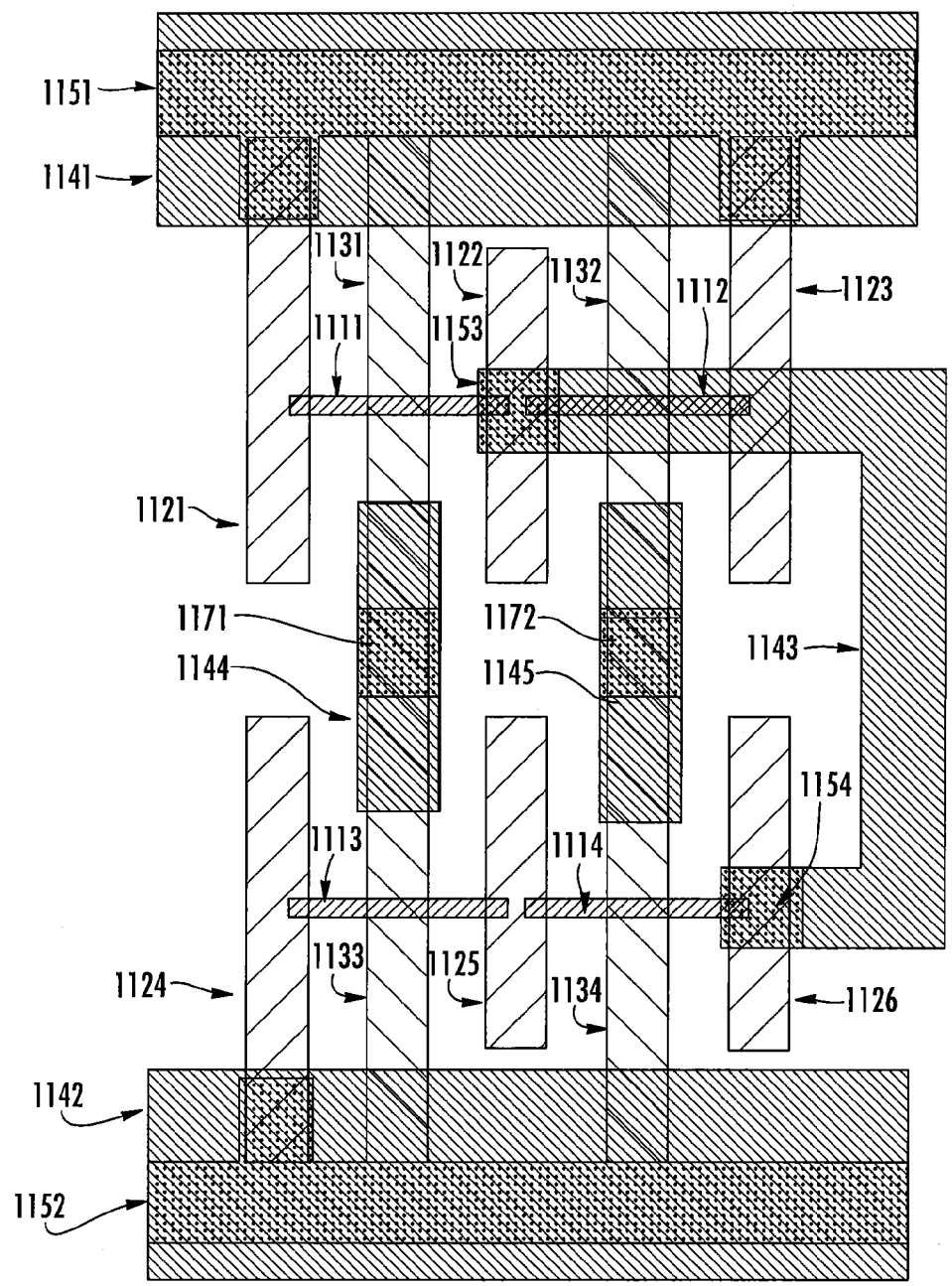
FIG. 11 is a plan view schematically illustrating a semiconductor device according to some embodiments of the inventive concept.

Reference is now made to FIG. 11, which is a plan view schematically illustrating a semiconductor device according to some embodiments of the inventive concept. An integrated circuit 1100 may include a first p-channel finFET 1111, a second p-channel finFET 1112, a first n-channel finFET 1113, and a second n-channel finFET 1114 that may be substantially similar to the finFETs 1011-1014 of FIG. 10. The integrated circuit 1100 may include trench contact regions 1121-1126 on respective source/drain regions of the finFETs 1111-1114. The trench contact regions 1121-1126 may be substantially similar to the trench contact regions 1021-1026 of FIG. 10.

A first local interconnect layer may include a plurality of first local interconnects 1151-1154 that may electrically connect ones of the source/drain regions of the plurality of finFETs 1111-1114 to metal routes 1141-1143.

In some embodiments, a first local interconnect 1151 may electrically connect the first source/drain region of the first p-channel finFET 1111 and the second source/drain region of the second p-channel finFET 1112 to a power rail 1141. The power rail 1141 may provide an operating voltage to the integrated circuit 1100. The first local interconnect 1151 may include a linearly shaped conductive structure that may extend substantially parallel to the channels. The first local interconnect 1151 may include first and second appendages that may extend from the linearly shaped conductive structure to respectively contact trench contact regions, 1121 and 1123, to electrically connect to the respective source/drain regions. The first local interconnect 1151 may contact the power rail 1141 along a length of the linear shape to provide a lower electrical resistance therebetween.

In some embodiments, a first local interconnect 1152 may electrically connect the first source/drain region of the first n-channel finFET 1113 to a ground rail 1142. The first local interconnect 1152 may include a linearly shaped conductive structure that may extend substantially parallel to the channels. The first local interconnect 1152 may include an appendage that may extend from the linearly shaped conductive structure to contact trench contact region 1124 to electrically connect to the respective source/drain region. The first local interconnect 1152 may contact the ground rail 1142 along a length of the linear shape to provide a lower electrical resistance therebetween.

In some embodiments, a metal route 1143 may electrically connect the second source/drain region of the first p-channel finFET 1111 and the first source/drain region of the second p-channel finFET 1112 to the second source/drain region of the second n-channel finFET 1114. A first local interconnect 1153 may extend from the metal route 1143 to the trench contact region 1122 to electrically connect to the second source/drain region of the first p-channel finFET 1111 and the first source/drain region of the second p-channel finFET 1112. A first local interconnect 1154 may extend from the metal route 1143 to the trench contact region 1126 to electrically connect to the second source/drain region of the second n-channel finFET 1114. In some embodiments, the metal route 1143 may provide a logical output from the integrated circuit 1100.

In some embodiments, a second local interconnect 1171 may extend from one or both of the gate stacks 1131 and 1133 to electrically connect the gate stacks 1131 and 1133 of the finFETs 1111 and 1113 to a metal route 1144. Similarly, a second local interconnect 1172 may extend from one or both of the gate stacks 1132 and 1134 to electrically connect the gate stacks 1132 and 1134 of the finFETs 1112 and 1114 to a metal route 1145. In some embodiments, the metal routes 1144 and 1145 may provide respective logical input to the integrated circuit 1000.

While the inventive concept has been described with reference to some embodiments, it will be apparent to those skilled in the art that various changes and modifications may be made without departing from the spirit and scope of the inventive concept. For example, various embodiments are illustrated but other embodiments may provide more or fewer finFETs and/or various configurations of electrical connections. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device, comprising:
    a first finFET and a second finFET on a semiconductor substrate, the first finFET comprising:
        a channel;
        a first source/drain region that is adjacent a first side of the channel;
        a second source/drain region that is adjacent a second side of the channel that is opposite the first side; and
        a gate stack on a top surface of the channel and that extends down a sidewall surface of the channel;
    a metal routing layer comprising first and second metal routes that are separated from the first finFET in a vertical direction;
    a first local interconnect layer comprising a first local interconnect that contacts the first metal route of the plurality of metal routes and that provides an ohmic electrical connection between the first metal route and the first source/drain region through a trench contact region that extends from the first local interconnect to the first source/drain region; and
    a second local interconnect layer comprising a second local interconnect that contacts the second metal route of the plurality of metal routes and that provides an ohmic electrical connection between the second metal route and the gate stack,
    wherein the first local interconnect comprises a linearly shaped conductive structure with a longest dimension that extends in a direction that is substantially parallel to a channel length of the channel of the first finFET and provides an ohmic electrical connection between the first source/drain region of the first finFET and a third source/drain region of the second finFET.

2. The semiconductor device of claim 1, wherein the first local interconnect extends over the gate stack of the first finFET and is electrically insulated from the gate stack of the first finFET.

3. The semiconductor device of claim 1, wherein the first local interconnect provides an ohmic electrical connection between the first source/drain region of the first finFET, the third source/drain region of the second finFET, and a power rail in the metal routing layer.

4. The semiconductor device of claim 3, wherein the linearly shaped conductive structure of the first local interconnect contacts the power rail along a length of the structure.

5. The semiconductor device of claim 4,
    wherein the linearly shaped conductive structure of the first local interconnect comprises a first and second appendages that extend from the structure in a direction substantially perpendicular to the length of the structure,
    wherein the first appendage provides an ohmic electrical connection between the power rail and the first source/drain region of the first finFET, and
    wherein the second appendage provides an ohmic electrical connection between the power rail and the third source/drain region of the second finFET.

6. The semiconductor device of claim 1,
    wherein the second local interconnect comprises a longest dimension that extends in a direction that is substantially parallel to the channel of the first finFET and provides an ohmic electrical connection between the gate stack of the first finFET and a gate stack of the second finFET.

7. The semiconductor device of claim 1,
    wherein the semiconductor device comprises a polycrystalline silicon region contacting the gate stack of the first finFET that comprises a longest dimension that extends in a direction that is substantially parallel to the channel of the first finFET and that provides an ohmic electrical connection between the gate stack of the first finFET and a gate stack of the second finFET.

8. The semiconductor device of claim 7, wherein the second local interconnect contacts the polycrystalline silicon region.

9. A method of manufacturing a semiconductor device, the method comprising:
    forming a plurality of finFETs on a first surface of a semiconductor substrate;
    forming a plurality of trench contact regions that contact ones of source/drain regions of the plurality of finFETs, wherein a first distance from top surfaces of the plurality of trench contact regions to the first surface of the semiconductor substrate is greater than a second distance from top surfaces of gate stacks of the plurality of finFETs to the first surface of the semiconductor substrate;
    forming a plurality of first local interconnects that contact ones of the plurality of trench contact regions;
    forming a plurality of second local interconnects that contact ones of the gate stacks of the plurality of finFETs, wherein top surfaces of the second local interconnects are substantially coplanar with top surfaces of the first local interconnects; and
    forming a metal routing layer that includes a plurality of conductors that contact ones of the first and second local interconnects.

10. The method of claim 9, wherein forming the plurality of finFETs comprises forming a polycrystalline silicon region that extends from a first gate stack of a first finFET of the plurality of finFETs to a second gate stack of a second finFET of the plurality of finFETs in a direction that is substantially parallel to fins of the first and second finFETs.

11. The method of claim 9, wherein forming the plurality of trench contact regions comprises forming a trench contact region that extends from a first source/drain region of a first finFET of the plurality of finFETs to a second source/drain region of a second finFET of the plurality of finFETs in a direction that is substantially parallel to fins of the first and second finFETs.

12. The method of claim 9, wherein forming the plurality of first local interconnects comprises forming a first local interconnect that extends from a first source/drain region of a first finFET of the plurality of finFETs to a second source/drain region of a second finFET of the plurality of finFETs in a direction that is substantially parallel to fins of the first and second finFETs.

13. The method of claim 12,
wherein the first local interconnect that extends from the first source/drain region of the first finFET to the second source/drain region of the second finFET contacts a power rail along a length of the first local interconnect,
wherein the first local interconnect includes a first appendage that extends in a direction substantially perpendicular to the length of the first local interconnect and that provides an ohmic electrical connection between the power rail and the first source/drain region of the first finFET, and
wherein the first local interconnect includes a second appendage that extends in a direction substantially perpendicular to the length of the first local interconnect and that provides an ohmic electrical connection between the power rail and the second source/drain region of the second finFET.

14. The method of claim 9, wherein forming the plurality of second local interconnects comprises forming a second local interconnect that extends from a first gate stack of a first finFET of the plurality of finFETs to a second gate stack of a second finFET of the plurality of finFETs in a direction that is substantially parallel to fins of the first and second finFETs.

15. An integrated circuit, comprising:
a plurality of finFETs, comprising a first p-channel finFET, a second p-channel finFET, a first n-channel finFET, and a second n-channel finFET, each of the plurality of finFETs comprising a channel, first and second source/drain regions on opposing sides of the channel, trench contact regions on the source/drain regions, and a gate stack on a top surface of the channel and that extends down a sidewall surface of the channel; and
a plurality of first local interconnects in a first local interconnect layer, wherein ones of the first local interconnects comprise:
a lower surface that contacts ones of the trench contact regions of the plurality of finFETs; and
an upper surface that contacts ones of an output route, a power rail, and a ground rail of a metal routing layer; and a second local interconnect in a second local interconnect layer comprising:
a lower surface that contacts ones of the gate stacks of the plurality of finFETs; and
an upper surface that contacts an input route of the metal routing layer,
wherein the channel of the first p-channel finFET is substantially collinear to the channel of the second p-channel finFET,
wherein the first source/drain region of the first p-channel finFET contacts the first source/drain region of the second p-channel finFET,
wherein the second source/drain region of one of the first and second p-channel finFETs is ohmically connected to the power rail,
wherein gate stacks of the first and second n-channel finFETs are substantially collinear to and contact gate stacks of the first and second p-channel finFETs respectively,
wherein the channel of the first n-channel finFET is substantially collinear to the channel of the second n-channel finFET,
wherein the first source/drain region of the first n-channel finFET contacts the first source/drain region of the second n-channel finFET, and
wherein the second source/drain region of one of the first and second p-channel finFETs is ohmically connected to the ground rail.

16. The integrated circuit of claim 15,
wherein the power and ground rails comprise a longest dimension that extends in a direction that is substantially parallel to the channels of ones of the plurality of finFETs,
wherein the second source/drain region of the one of the first and second p-channel finFETs is ohmically connected to the power rail through a first local interconnect comprising:
a first linearly shaped conductive structure that contacts the power rail along a length of the first linearly shaped conductive structure; and
an first appendage contacting the first linearly shaped conductive structure, extending from the first linearly shaped conductive structure in a direction substantially perpendicular to the length of the first linearly shaped conductive structure, and providing an ohmic electrical connection between the first linearly shaped conductive structure and the second source/drain region of the one of the first and second p-channel finFETs, and
wherein the second source/drain region of the one of the first and second n-channel finFETs is ohmically connected to the ground rail through a first local interconnect comprising:
a second linearly shaped conductive structure that contacts the ground rail along a length of the second linearly shaped conductive structure; and
a second appendage that extends from the second linearly shaped conductive structure in a direction substantially perpendicular to the length of the second linearly shaped conductive structure and provides an ohmic electrical connection between the second linearly shaped conductive structure and the second source/drain region of the one of the first and second n-channel finFETs.

17. The integrated circuit of claim 15, wherein the gate stack of the first n-channel finFET and the gate stack of the first p-channel finFET are ohmically connected to the gate stack of the second n-channel finFET and the gate stack of the second p-channel finFET through a second local interconnect that comprises a longest dimension that extends in a direction that is substantially parallel to the channels of one of the plurality of finFETs.

18. The integrated circuit of claim 15, wherein the gate stack of the first n-channel finFET and the gate stack of the first p-channel finFET are ohmically connected to the gate stack of the second n-channel finFET and the gate stack of the second p-channel finFET through a through a polycrystalline silicon region that comprises a longest dimension that extends in a direction that is substantially parallel to the channels of one of the plurality of finFETs.

\* \* \* \* \*